United States Patent
Strütt et al.

(10) Patent No.: US 11,277,920 B2
(45) Date of Patent: Mar. 15, 2022

(54) METHOD FOR MECHANICAL CONTACTING OF A POTTING FRAME ON A PRINTED CIRCUIT BOARD

(71) Applicant: Endress+Hauser SE+Co. KG, Maulburg (DE)

(72) Inventors: Bernd Strütt, Steinen (DE); Simon Gerwig, Schopfheim (DE); Max Bauer, Rheinfelden (DE)

(73) Assignee: ENDRESS+HAUSER SE+CO. KG, Maulburg (DE)

( * ) Notice: Subject to any disclaimer, the term of this patent is extended or adjusted under 35 U.S.C. 154(b) by 0 days.

(21) Appl. No.: 16/755,112

(22) PCT Filed: Sep. 11, 2018

(86) PCT No.: PCT/EP2018/074489
§ 371 (c)(1),
(2) Date: Apr. 9, 2020

(87) PCT Pub. No.: WO2019/072475
PCT Pub. Date: Apr. 18, 2019

(65) Prior Publication Data
US 2020/0245470 A1 Jul. 30, 2020

(30) Foreign Application Priority Data
Oct. 10, 2017 (DE) ...................... 10 2017 123 530.2

(51) Int. Cl.
H05K 7/00 (2006.01)
H05K 3/28 (2006.01)
(Continued)

(52) U.S. Cl.
CPC ............ *H05K 3/284* (2013.01); *H05K 1/181* (2013.01); *H05K 3/3431* (2013.01); *H05K 2203/1316* (2013.01); *H05K 2203/1327* (2013.01)

(58) Field of Classification Search
CPC ...... H05K 3/284; H05K 3/3431; H05K 1/181; H05K 2203/1316; H05K 2203/1327
(Continued)

(56) References Cited

U.S. PATENT DOCUMENTS 9,013,283 B1 * 4/2015 Tackaberry ............ G06Q 10/08
340/12.54
2010/0170700 A1 * 7/2010 Nakamura ........... H05K 3/4614
174/254

(Continued)

FOREIGN PATENT DOCUMENTS

DE 102009016762 A1 10/2010
EP 0942503 A2 9/1999
(Continued)

*Primary Examiner* — Andargie M Aychillhum
(74) *Attorney, Agent, or Firm* — Mark A. Logan; Endress+Hauser (USA) Holding Inc.

(57) ABSTRACT

The invention relates to a method for mechanical connecting especially of a potting frame to a printed circuit board of an electrical/electronic module. The potting frame includes a metal contact area. The printed circuit board includes a surface area structured metallically corresponding to the contact area. The method includes positioning the mechanical component with the contact area facing the corresponding surface area, and soldering the mechanical component to the printed circuit board via the contact area and the surface area. The method the advantage that a material saving encapsulation can be provided for electrical/electronic modules in explosion endangered regions. An additional process step for mechanical connecting of the encapsulation to the printed circuit board can be omitted, since the mechanical (Continued)

connecting of the potting frame can be performed in one process step together with the soldering of the additional electrical/electronic components to the printed circuit board.

6 Claims, 1 Drawing Sheet

(51) Int. Cl.
  *H05K 1/18* (2006.01)
  *H05K 3/34* (2006.01)
(58) Field of Classification Search
  USPC .......................................................... 361/760
  See application file for complete search history.

(56) References Cited

U.S. PATENT DOCUMENTS

| 2014/0184451 | A1* | 7/2014 | Kuo ......................... H01Q 1/40 |
|---|---|---|---|
| | | | 343/702 |
| 2015/0380697 | A1* | 12/2015 | Osborne ............ H01M 50/502 |
| | | | 429/91 |
| 2018/0228020 | A1* | 8/2018 | Gotz .................. H01R 12/7088 |
| 2020/0066610 | A1* | 2/2020 | Strutt .................... H05K 7/1462 |

FOREIGN PATENT DOCUMENTS

| JP | WO 2009/069236 | * | 5/2009 |
|---|---|---|---|
| WO | 2007116544 A1 | | 10/2007 |
| WO | 2009069236 A1 | | 6/2009 |

* cited by examiner

METHOD FOR MECHANICAL CONTACTING OF A POTTING FRAME ON A PRINTED CIRCUIT BOARD

CROSS-REFERENCE TO RELATED APPLICATIONS

The present application is related to and claims the priority benefit of German Patent Application No. 10 2017 123 530.2, filed on Oct. 10, 2017 and International Patent Application No. PCT/EP2018/074489, filed on Sep. 11, 2018, the entire contents of which are incorporated herein by reference.

TECHNICAL FIELD

Background

In process automation technology, field devices are often applied, which serve for registering, or also influencing, process variables. Applied for registering process variables are sensors, which are used, for example, in fill level measuring devices, flowmeters, pressure- and temperature measuring devices, pH-redox potential-measuring devices, conductivity measuring devices, etc. These register corresponding process variables, such as fill level, flow, pressure, temperature, pH value, redox potential and conductivity. In general, also referred to as field devices are all devices, which are applied near to the process and which deliver, or process, process relevant information. Therefore, in connection with the invention, the terminology, field devices, refers supplementally also to remote I/Os, radio adapters, and, generally, electronic components, which are arranged at the field level. A large number of these field devices are produced and sold by the firm, Endress+Hauser.

Especially, the electronics modules in field devices must be encapsulated due to their special conditions of use. This serves, on the one hand, for protecting the electronics modules from process-specific environmental influences, such as dust, temperature or corrosive atmosphere. On the other hand, the encapsulation is absolutely required, since the field device (and, thus, also its electronics modules) in explosion endangered regions must satisfy corresponding explosion protection specifications.

Effective explosion protection measures are defined in relevant standards. Corresponding specifications are established in Europe, for example, by the series of standards, EN 60079. These provide, for example, that pressure encapsulation and potting material encapsulation be applied for explosion safe encapsulation of electronic components. In the case of a potting material, this is explosion protection type "m" falling under the standard, EN 60079-18. In the case of pressure resistant encapsulation, such is explosion protection type "d" falling under the standard, EN 60079-1.

In the case of encapsulation with potting material, it is known from the state of the art to encapsulate the electronics module, thus, the printed circuit board including the electrical/electronic components arranged thereon, completely. In such case, depending on whether the printed circuit board is populated on just one side or on both sides, at least the populated side of the printed circuit board is provided full surface all around with a, for example, plastic based, potting frame (for example, by adhering the potting frame). Then the resulting inner space between the lid and the printed circuit board is cast with potting compound. Used for this is preferably an elastomer, for example, SilGel® silicone gel.

As regards its design and its protective covering action, this type of encapsulation is very solid due to its full surface application. Disadvantageous, however, is that, besides populating and electrically connecting the electrical/electronic components, at least one additional process step is required for positioning and securing the potting frame on the printed circuit board. Additionally, the material consumption in the case of this type of encapsulation is comparatively high. For although, as a rule, it is only required to encapsulate the energy-, or power, intensive electrical/electronic components, such as capacitors with high capacitance or high powered ICs, the printed circuit board in the case of this type of encapsulation must be completely potted, at least unilaterally.

SUMMARY

An object of the invention, therefore, is to provide a safe encapsulation for electrical/electronic modules, especially a safe encapsulation, which can be installed efficiently.

The invention achieves this object by a method for mechanical connecting of a mechanical component to a printed circuit board of an electrical/electronics module. The terminology, "mechanical component", refers in the context of the invention generally to any component, which has no electrical/electronic function. In such case, the component of the invention has at least one metal contact area. The printed circuit board includes a surface area, which is structured metallically corresponding to the contact area. For the connecting, the method includes method steps as follows:

positioning the mechanical component with the contact area facing the corresponding surface area, and soldering the mechanical component to the printed circuit board via the contact area and the surface area.

The basic advantage of the method provides that it can be automated analogously to the electrical connecting. Thus, applied as soldering method for soldering the contact area to the surface area can be an automated soldering method, such as, for example, a reflow soldering method. To the extent that the mechanical component is designed to serve as a potting frame for potting electrical components located within the surface area, an additional method step further comprises the subsequent potting of the electrical components within the potting frame.

Therewith, the method of the invention offers, on the one hand, the advantage that a material saving encapsulation can be provided for electrical/electronic modules in explosion endangered regions. At the same time, an additional process step for mechanical connecting of the encapsulation on the printed circuit board can be omitted, since the mechanical connecting of the potting frame can be performed in one process step together with the soldering of the electrical components onto the printed circuit board. Because the potting can be so designed based on the method of the invention that the potted electrical/electronic components on the printed circuit board are encapsulated explosion safely, for example, according to the series of standards, EN 60079, the implementing of the electrical/electronic module is especially advantageous for a field device.

In order to be able to automate the positioning of the mechanical component, e.g. the potting frame, before the actual soldering, it is additionally advantageous that the contact area of the potting frame and the surface area the printed circuit board are designed in such a manner relative to one another, especially by mutually engaging means, the positioning of the potting frame is secure before the soldering to the printed circuit board. Therewith it is, for example, possible in the production of the printed circuit board to populate by means of an automated "Pick and Place" method besides the electrical/electronic components also the mechanical component.

For implementing the metal contact area, there is, on the one hand, the opportunity to produce the potting frame completely of a metal material. In addition, it is, however, also possible to produce the potting frame and the contact area by means of an injection molded circuit carrier method, also known under the terms "MID" and "Moulded Interconnect Device", especially by means of the method of laser direct structuring. In such case, it is possible by means of MID to configure the shape of the potting frame very individually, for example, square with rounded corners. Above all, using laser direct structuring, it is, moreover, an option to produce a potting frame with a non-flat contact area, to the extent that the printed circuit board, i.e. the surface area, is correspondingly curved or vaulted (also known as a "three dimensional circuit carrier").

BRIEF DESCRIPTION OF THE DRAWINGS

The invention will now be explained in greater detail based on the appended drawing, the figures of which show as follows.

DETAILED DESCRIPTION

Figure 1:
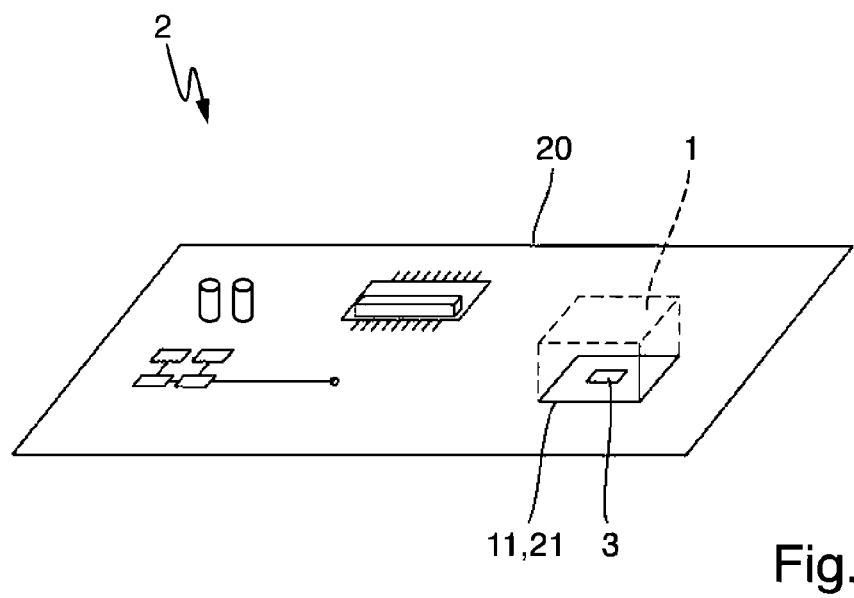
FIG. 1 shows an electrical/electronic module having a soldered potting frame of the invention.

For providing a general understanding of the invention, FIG. 1 shows a schematic view of an electrical/electronic module 2. The module is supported on a printed circuit board 20, which in the shown example of an embodiment is populated at least on top with electrical/electronic components 3. In order to be able to be applied in field devices, which are explosion safe, for example, according to the series of standards, EN 60079, components 3 critical as regards explosion protection are encapsulated.

For this, a potted encapsulation is provided based on a potting frame 1 wherein the potting frame 1 of the invention is mounted on the printed circuit board 1 by soldering. As evident in the detail view in FIG. 2, the potting frame 1 has for solder-connecting a solderable, metal contact area 11, which corresponds to a corresponding surface area 21 of the printed circuit board 20. In such case, the contact area 11 has in the illustrated embodiment a square shape with rounded corners corresponding to the shape of the potting frame 1. For soldering, the potting frame 1 does not have to be produced completely of a metal material. To the extent that the potting frame 1 is produced from a plastic, advantageous for integrated production of the potting frame 1 including metal contact area 11 is preferably the injection molded circuit carrier method, also known under the terms, "MID" and "Moulded Interconnect Device". An especially suitable variant for such is the method of laser direct structuring.

The surface area 21 on the printed circuit board 20 provided for mounting the potting frame 1 is likewise of metal, in order to be solderable. The surface area 21 can be implemented, consequently, for example, in the form of a conductive trace structure with shape corresponding to that of the contact area 11 of the potting frame 1. Thus, for implementing the surface area 21, apart from the per se required working steps for creating the conductive trace structures on the printed circuit board 20, no additional process steps need to be performed. In the case of the embodiment of the invention shown in FIGS. 1 and 2, the printed circuit board 20 is flat in the region of the surface area 21. Alternatively, it would be possible in the case of a convexly curved surface area 21 of a printed circuit board 20 to implement the potting frame with a correspondingly concavely curved contact area 11, especially using laser direct structuring. The type of potted encapsulation shown in FIG. 1 offers thus, as a whole, the advantage that the mechanical connecting of the potting frame 1 can occur in one process step together with the soldering of the electrical/electronic components 3 to the printed circuit board 11. Above all, in a soldering method such as reflow soldering, in the case of which the electrical components 3 are all soldered simultaneously, a time saving results in comparison with a possible additional adhering step. Then, only still to be done is the potting of the electrical/electronic components 3 within the potting frame 1, preferably by means of an elastomer.

In order to connect the potting frame 1 per soldering to the printed circuit board 20, it is necessary, analogously to the electrical/electronic components 3, to position the potting frame 1 with orientation of the contact area 11 facing the surface area 21. Such can be facilitated, for example, by mechanically pre-securing the contact area 11 of the potting frame 1 and the surface area 21 of the printed circuit board 2 relative to one another, especially by mutually engaging means, for example, by means of a plug and socket arrangement (not shown). In this way, the mechanical component 1 does not need to be externally held during the soldering to the printed circuit board 20 via the contact area 11 and the surface area 21.

Figure 2:
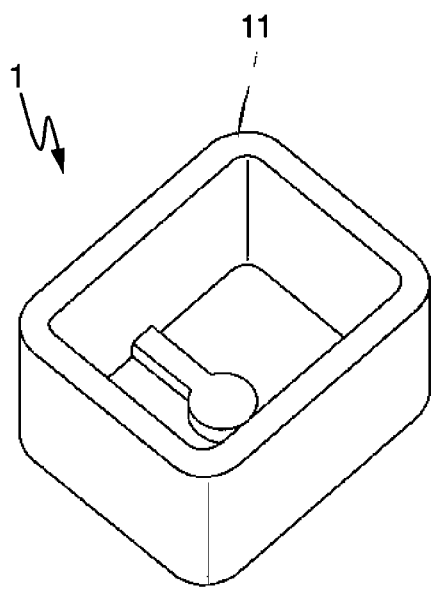
FIG. 2 shows a detail view of a possible form of embodiment of the potting frame.

Analogously to the example of an embodiment shown in FIGS. 1 and 2, in the case of which the potting frame 1 is soldered to the printed circuit board 20 as mechanical component without an electrical function, the invention can be used also for connecting any other mechanical component to a printed circuit board, such as, for example, miniaturized mechanical- or mirror components. Proviso for such is only that such other component must have a solderable contact area 11.

The invention claimed is:

1. A method for a mechanical connecting of a potting frame to a printed circuit board of an electrical/electronic module, wherein the potting frame has at least one metal contact area, and wherein the printed circuit board includes a surface area metallically corresponding to the at least one metal contact area, and wherein the potting frame serves for potting electrical/electronic components within the surface area, the method comprising:

positioning the potting frame with the at least one metal contact area facing the corresponding surface area;

soldering the potting frame to the printed circuit board via the at least one metal contact area and the surface area and soldering the electrical/electronic components to the printed circuit board, wherein the soldering of the potting frame and the soldering of the electrical/electronic components are done together in a same process step; and potting the electrical/electronic components within the potting frame.

2. The method as claimed in claim 1, wherein a reflow soldering method is applied for the step of soldering the at least one metal contact area to the surface area and the electrical/electronic components to the printed circuit board.

3. The method as claimed in claim 1,
wherein the at least one metal contact area of the potting frame and the surface area of the printed circuit board are designed in such a manner relative to one another, including by mutually engaging means, in order to secure positioning of the potting frame before the soldering to the printed circuit board.

4. The method as claimed in claim 1, wherein the potting frame including the at least one metal contact area is produced by an MID method, including by laser direct structuring.

5. The method as claimed in claim 1, wherein the potting of the electrical/electronics components within the potting frame explosion safely encapsulates the electrical/electronic components according to the series of standards, EN 60079.

6. The method as claimed in claim 1,
wherein the at least one metal contact area extends along an entire perimeter of the potting frame, and
wherein the surface area on the printed circuit board corresponding to the at least one metal contact area is a conductive trace on the printed circuit board having a same size and shape as the at least one metal contact area.

\* \* \* \* \*